United States Patent
Rien et al.

(10) Patent No.: US 8,957,703 B2
(45) Date of Patent: Feb. 17, 2015

(54) PROTECTING LOWER VOLTAGE DOMAIN DEVICES DURING OPERATION IN A HIGHER VOLTAGE DOMAIN

(75) Inventors: Mikael Rien, St Ismier (FR); Jean-Claude Duby, Saint Egreve (FR); Flora Leymarie, Claix (FR); Fabrice Blanc, Vinay (FR); Thierry Padilla, Claix (FR)

(73) Assignee: ARM Limited, Cambridge (GB)

( * ) Notice: Subject to any disclaimer, the term of this patent is extended or adjusted under 35 U.S.C. 154(b) by 1228 days.

(21) Appl. No.: 12/662,198

(22) Filed: Apr. 5, 2010

(65) Prior Publication Data
US 2010/0271736 A1    Oct. 28, 2010

(30) Foreign Application Priority Data
Apr. 20, 2009    (GB) .................................... 0906775.2

(51) Int. Cl.
H03K 19/0175    (2006.01)
H03K 19/003    (2006.01)

(52) U.S. Cl.
CPC ................................ *H03K 19/00315* (2013.01)
USPC .................. 326/81; 326/68; 326/83; 327/112; 327/333

(58) Field of Classification Search
USPC ............... 326/62, 58, 57, 81–83, 86–87, 121; 327/108–109, 112, 333, 434–437
See application file for complete search history.

(56) References Cited

U.S. PATENT DOCUMENTS

| | | | | |
|---|---|---|---|---|
| 5,852,375 A * | 12/1998 | Byrne et al. | .................. | 327/108 |
| 6,118,301 A * | 9/2000 | Singh et al. | ..................... | 326/58 |
| 6,144,221 A * | 11/2000 | Oshima | .......................... | 326/80 |
| 6,671,816 B1 | 12/2003 | Woo | | |
| 7,123,460 B2 | 10/2006 | Ajit | | |
| 7,227,400 B1 * | 6/2007 | Gillespie et al. | .............. | 327/333 |
| 2004/0140841 A1 * | 7/2004 | Mitarashi | ...................... | 327/333 |
| 2005/0040854 A1 * | 2/2005 | Mentze et al. | .................. | 326/81 |
| 2005/0046449 A1 * | 3/2005 | Davis | .......................... | 327/112 |
| 2006/0066355 A1 * | 3/2006 | Gosmain et al. | ................ | 326/87 |
| 2007/0057703 A1 * | 3/2007 | Kumar et al. | ................. | 327/112 |
| 2007/0257706 A1 * | 11/2007 | Kesselring | ....................... | 326/83 |
| 2008/0068050 A1 * | 3/2008 | Ajit | ............................. | 327/108 |
| 2009/0009217 A1 * | 1/2009 | Huitsing et al. | ................ | 326/68 |

OTHER PUBLICATIONS

UK Search Report dated Aug. 5, 2009 for GB 0906775.2.

* cited by examiner

*Primary Examiner* — Thienvu Tran
*Assistant Examiner* — Christopher Lo
(74) *Attorney, Agent, or Firm* — Nixon & Vanderhye P.C.

(57) ABSTRACT

Circuitry comprises a high voltage rail providing a high voltage level corresponding to a higher voltage domain, an intermediate voltage source, a low voltage rail, and devices that operate in a lower voltage domain. First devices in an upper voltage region are powered between the high voltage rail and an intermediate voltage rail powered by the intermediate source. Second devices in a lower voltage region are powered between the intermediate and low rails. On power up, the intermediate source is powered before the high voltage rail. An isolating circuit connects the intermediate source to a node when the high voltage rail is powered and isolates the node from the intermediate source when the high voltage rail is not powered to impede current flow from the intermediate source to the high voltage rail.

18 Claims, 7 Drawing Sheets

100
PROTECTING LOWER VOLTAGE DOMAIN DEVICES DURING OPERATION IN A HIGHER VOLTAGE DOMAIN

FIELD OF THE INVENTION

The field of the invention relates to circuitry operating in a higher voltage domain using devices configured to operate in a lower voltage domain.

BACKGROUND

Advances in the field of electronics have led to a reduction in both core and input-output power supplies in order to increase speed and reduce power consumption. The transistor dimensions and oxide thickness have also decreased for the same speed reasons.

Thus, for devices of 45 nm, the "standard" external power is now 1.8V where it was previously 3.3V or 2.5V. In order to be able to reach high frequencies the oxide thickness has been decreased and is now around 28 to 32 Å for 1.8V devices (where previously it was about 50 Å).

There are now some apparatus that operate with these new smaller more fragile devices in circuits that have to handle signals suitable for the old higher voltage domains. For example, to be compatible with some older chips and a few standard protocols some input-output cells must operate at a nominal 3.3V to generate signals at this level using the new devices that operate at a nominal 1.8V.

In order to ensure that these devices are not overstressed with the accompanying problems of oxide breakdown and lifetime degradation due to HCI (hot carrier injection) precautions need to be taken.

One way of protecting the devices is to provide an intermediate voltage supply, such that the higher voltage domain is divided in two. This intermediate voltage supply may be the high voltage supply of the lower power domain of the new devices, in this example 1.8V. The devices can then be arranged either between this intermediate voltage level and the high voltage level of the higher voltage domain, in this case 3.3 V, or between the intermediate voltage level and ground. In this way the devices only see half of the 3.3V across them and they are protected. However, care must be taken on power up that the 3.3V does not switch on before the 1.8V intermediate level as if it did some devices would see the full 3.3V and be overstressed. Thus, these circuits are set up so that the intermediate voltage is always switched on before the high voltage.

There can be additional problems that arise due to the intermediate voltage level being switched on before the high voltage level signal and the present invention seeks to address these problems.

Care must also be taken for devices that actually receive or output the high level signals that they too are not overstressed.

SUMMARY

A first aspect of the present invention provides circuitry comprising: a high voltage rail for providing a high voltage level corresponding to a first higher voltage domain; an intermediate voltage source, a low voltage rail; and a plurality of devices configured to operate in a second lower voltage domain; said circuitry being configured such that a first set of said plurality of devices are arranged in an upper voltage region where they are powered between said high voltage rail and an intermediate voltage rail powered by said intermediate voltage source and a second set of said plurality of devices are arranged in a lower voltage region where they are powered between said intermediate voltage rail and said low voltage rail, said circuitry being configured such that on power up said intermediate voltage source is powered before said high voltage rail, said circuitry further comprising: an isolating circuit arranged in said upper voltage region, said isolating circuit comprising at least one switching device for connecting said intermediate voltage source to at least one node in said circuitry in response to said high voltage rail being powered, and for isolating said at least one node from said intermediate voltage source and for connecting said at least one node to said high voltage rail in response to said intermediate voltage source being powered and said high voltage rail not being powered in order to impede current flow from said intermediate voltage source to said high voltage rail via said node when said high voltage rail is not powered.

The present invention recognises that an intermediate voltage supply can be used to protect devices that are not designed to operate in the higher voltage domain by dividing the higher voltage domain into upper and lower voltage regions that have a smaller voltage drop across them than the higher voltage domain, this smaller voltage drop being suitable for operation of these devices. It also recognises that during power sequencing it is important that the high voltage rail does not go high before the intermediate voltage is present to protect the devices. However, providing an intermediate voltage when the high voltage rail is low can present its own problems as during this time there will be portions of the circuitry that may be reversed biased. This can lead to high leakage currents.

The present invention addresses this by providing an isolating circuit that ensures that a node in the circuitry is connected to the intermediate voltage source when the high voltage rail is powered. It should be noted that when the high voltage rail is powered the intermediate voltage source is also powered as this is a requirement for protecting the devices. When the intermediate voltage source is powered and the high voltage rail is not powered, the isolating circuit isolates the node from the intermediate voltage source and connects it to the high voltage rail. By providing an isolating circuit that switches in this way current flow from the intermediate voltage source to the high voltage rail via the node can be prevented.

Thus, such an isolating circuit can be arranged to connect to any node in the circuit where leakage current may be expected when the intermediate voltage source is powered and the high voltage rail is not powered.

It should be noted that a node can be any point in the circuit, for example it could be a point in a connecting wire or it could be a junction between devices or an input of a device or it could be a well of a device.

Although the intermediate voltage source could have any voltage level suitable for dividing the higher voltage domain and protecting the devices, in some embodiments said intermediate voltage source is a source providing a high voltage level of said second lower voltage domain.

The reason that circuitry needs to handle signals in the higher voltage domain using devices configured for the lower voltage domain, is for example in interface circuitry between different circuits operating in the two different domains. In such interface circuitry there is generally a source for the high voltage level of the second lower voltage domain available and it is therefore very convenient to use this as the intermediate voltage source.

In some embodiments, said at least one switching device of said isolating circuit is responsive to said high voltage rail reaching a predetermined value from a non-powered state and said intermediate voltage source being powered to switch and to connect said intermediate voltage rail and not said high voltage rail to said at least one node, said predetermined value being within 20% of a voltage level of said intermediate voltage source.

As the high voltage rail is powered up then the at least one switching device in the isolating circuit switches so that the intermediate voltage rather than the high voltage rail is connected to the node. The isolating circuit is designed so that it switches when the high voltage rail reaches a predetermined value. This value is in the region of the intermediate voltage as at this point, there will not be a problem of leakage currents due to reverse biasing of devices and it protects the devices from receiving a voltage that is significantly higher than the intermediate voltage and thereby stressing them. The actual value can be set by designing the switching device appropriately.

In some embodiments, said isolating circuit comprises: a first switch arranged between said intermediate voltage source and said node, said first switch being responsive to a voltage level of said high voltage rail, such that in response to said high voltage rail being powered, said intermediate voltage source is connected to said node and in response to said high voltage rail not being powered said intermediate voltage source is isolated from said node; and a second switch arranged between said high voltage rail and said node, said second switch being responsive to said high voltage rail not being powered to connect said node to said high voltage rail and being responsive to said high voltage rail being powered to isolate said node from said high voltage rail; wherein said first and second switches consume current to switch and consume only leakage currents when switched.

Although the isolating circuit can be arranged in a number of ways provided it has the required functionality, one way of doing it is by using one switch for connecting and disconnecting the intermediate voltage source to the node and one for connecting and disconnecting the high voltage rail to the node. These switches consume power as they switch but once they are switched they do not consume power and this is advantageous as power consumption is reduced.

A simple and effective way of implementing the switches is to use transistors.

If transistors are used as the switches then by using appropriate threshold values, they can be tuned to switch when the voltage level on the higher voltage rail reaches a value close to the intermediate voltage source level, thereby providing excellent protection and reducing leakage currents.

In some embodiments, said circuitry comprises an electrostatic discharge protection device comprising two discharge devices arranged in series between said high voltage rail and said low voltage rail, said two discharge devices being configured to operate in said second lower voltage domain, and said node being a node between said two devices.

One embodiment where this circuitry is particularly useful is in electrostatic discharge protection devices such as electrostatic discharge clamps. These devices provide protection from spikes in the power supply. However, when arranged in circuitry operating in a higher power domain, they need to be protected from the higher voltage domain with the intermediate voltage source. However, where the intermediate voltage source is powered and the high voltage rail is not the problem of reverse biasing these devises arises, where they can be inadvertently made conducting. This is to be avoided as they are particularly large devices and are designed to conduct a large amount of current. Thus, holding a node that lies between the two discharge devices that are arranged in series at the intermediate voltage when the high voltage rail is powered will protect the devices, and connecting it to the high voltage rail when the high voltage rail is not powered will prevent the devices from being reverse biased and avoid the substantial leakage current problem.

In some embodiments, a first of said two discharge devices comprises: a first transistor arranged between said high level voltage rail and said node, and a first resistive capacitive path arranged between said high voltage rail and said node, said gate of said first transistor being connected to said first resistive capacitive path; a second of said two discharge devices comprises: a second transistor arranged between said node and said low level voltage rail and a second resistive capacitive path arranged between said node and said low voltage rail, said gate of said second transistor being connected to said second resistive capacitive path; such that a sudden change in voltage level causes a current to flow in said first and second resistive capacitive paths and turns said first and second transistors on, said node being connected to said intermediate voltage source via said isolating circuit when said high voltage rail and said intermediate voltage rail are powered.

The electrostatic discharge device may be made of two large transistors that are turned on by RC triggers that recognise spikes in voltage. The node would be located between the two transistors and also on the capacitive resistive path and between the resistive capacitive paths or triggers. This would provide the required intermediate voltage level protection from the high voltage rail during normal operation and avoid the problems that arise with reverse biasing.

In some embodiments, said at least one switching device of said isolating circuit for connecting said intermediate voltage source to said at least one node in said circuitry is configured to provide at least some isolation from a capacitance of said intermediate voltage rail.

A further and significant advantage of the isolating circuit arises if it is configured to provide capacitive isolation between the intermediate voltage rail and the at least one node. When the intermediate voltage rail is connected to the intermediate voltage source the capacitance of this voltage source is an unknown value as it depends on the number of input-output cells that the source is powering. Connecting an unknown capacitance to a node that is connected to the resistive capacitive triggers of the electrostatic discharge device is not a good idea as this will affect their reaction time in an unknown way and may mean that they no longer respond to spikes of a common frequency in the voltage levels. Thus, providing a device that isolates this unknown capacitance from the electrostatic discharge device is extremely advantageous.

In some embodiments, said at least one node is connected to a p-well of at least one NFET device in said first set of devices.

Further circuitry where embodiments of this device are particularly useful is where there is an NFET device in the first set of devices arranged between the high voltage rail and the intermediate voltage rail. NFET devices have P-wells that are generally tied to the drain voltage. However, in the case that the drain voltage rather than being the lower voltage is the higher voltage, which would occur if the high voltage rail is turned off and the intermediate voltage rail is powered then there is a leakage path through the parasitic diode of this device up to the high voltage rail. In order to avoid this happening, if the isolating circuit is used to connect to a node that is connected to this P-well the bias voltage of the P-well can be controlled so that it is held at the level of the high voltage rail when this is not powered rather than at the level of the intermediate voltage source. This prevents the leakage current flowing from the intermediate voltage source to the higher voltage rail through the wells of this device.

In some embodiments, said first set of devices comprises a plurality of NFET devices, said circuitry comprising a plurality of nodes corresponding to said plurality of NFET devices, each of said plurality of nodes being connected to a p-well of said corresponding NFET device.

The NFET devices in the first set of devices arranged in the upper voltage region will all suffer from this problem and thus, it is advantageous if in some embodiments all of the p-wells of these devices are used as the nodes that the isolating circuit controls the voltage of.

In some embodiments, said circuitry comprises a control device responsive to said high voltage rail not being powered to switch said at least one NFET device off such that it does not conduct current between said intermediate voltage source and said high voltage rail.

An additional problem with NFET devices in the first set of devices in the upper region is that when the high voltage rail is low and the intermediate voltage source powered then they become reverse biased and may well switch on. This is an additional source of leakage current and thus, it is advantageous if a control device is used which is responsive to the high voltage rail not being powered to switch the NFET devices off.

It should be noted that any NFET device that is on a current path between the high voltage rail and the intermediate voltage source should be switched off. However, if there are a number of them in series, then only one of the ones in series needs to be switched off as clearly there will no longer be a current path if any one of them in the series path is switched off.

The control device can be configured in a number of ways, in some embodiments it comprises a transistor arranged to receive a signal from said intermediate voltage source at its gate and being arranged between said high voltage rail and an input of said at least one NFET device, such that when said high power rail is powered said control device is switched off and when said high power rail is not powered and said intermediate voltage rail is powered said control device transmits a control signal from said high power rail to switch said NFET device off.

In some embodiments, said at least one node is connected to a n-well of at least one PFET device in said first set of devices.

In some embodiments rather than controlling the NFET to stop leakage currents when it is reverse biased, the PFETs in the first set of devices could be controlled. PFET devices have n-wells that are generally tied to the source voltage. However, in the case that the source voltage rather than being the higher voltage is the lower voltage, which would occur if the high voltage rail is turned off and the intermediate voltage rail is powered then there is a leakage path through the parasitic diode of this device up to the high voltage rail. In order to avoid this happening, if the isolating circuit is used to connect to a node that is connected to this n-well the bias voltage of the n-well can be controlled so that it is held at the level of the intermediate voltage source when the high voltage rail is not powered rather than at the level of the high voltage rail. This prevents the leakage current flowing from the intermediate voltage source to the higher voltage rail through the wells of this device.

Furthermore, in a similar way to the NFET switching circuitry should be provided to ensure that when the high voltage rail is not powered and the intermediate voltage source is the gate of the PFET is held at a high voltage so that it is turned off.

In some embodiments, said at least one node comprises said intermediate voltage rail, such that said isolating circuit is configured to connect said intermediate voltage rail to said intermediate voltage source in response to said high power rail being powered and to isolate said intermediate voltage source from said intermediate voltage rail in response to said intermediate voltage source being powered and said high power rail not being powered.

One simple way of addressing the problem of reverse biasing of the upper voltage region is to use the intermediate voltage rail as the node so that this is not actually powered up when the intermediate voltage source is powered up but is responsive to the higher voltage rail voltage level rising to power up. Provided the powering is controlled in a suitable manner then this provides the protection required by providing an intermediate voltage level when the high voltage rail level reaches the intermediate voltage level and this stops there from being the reverse bias problem, while still maintaining protection for the devices from the higher voltage levels.

In some embodiments, said circuitry comprises an input-output cell for receiving a signal from said second lower voltage domain and for generating and outputting a signal to said first higher voltage domain.

Although the circuitry can comprise a number of different things, it is particularly appropriate for input-output cells that receive signals from the lower voltage domain and are in fact built of devices from this domain but need to signal to legacy devices that operate in the older high powered domains. Thus, these cells receive low power signals and output high power signals and thus, their devices need to be protected from the higher voltage level of the higher power domain.

In some embodiments, said input-output cell comprises a cascoded output driver arranged between said high voltage rail and said low voltage rail, said intermediate voltage rail providing an intermediate voltage for said cascoded output driver.

A second aspect of the present invention provides a method of impeding current flow from an intermediate voltage source to a high voltage rail via a node in circuitry when said high voltage rail is not powered, said circuitry comprising a high voltage rail corresponding to a first higher voltage domain, an intermediate voltage source, said intermediate voltage source corresponding to a high voltage level of a second lower voltage domain and a low voltage rail, a plurality of devices configured to operate in said lower voltage domain, said circuitry being configured such that a first set of said plurality of devices are arranged in an upper voltage region where they are powered between said high voltage rail and an intermediate voltage rail powered by said intermediate voltage source and a second set of said plurality of devices are arranged in a lower voltage region where they are powered between said intermediate voltage rail and said low voltage rail, said circuitry being configured such that on power up said intermediate voltage source is powered before said high voltage rail, said circuitry further comprising: said method comprising the steps of: in response to said intermediate voltage source being powered and said high voltage rail not being powered: isolating said at least one node from said intermediate voltage source and connecting said at least one node to said high voltage rail; and in response to said high voltage rail being powered: connecting said intermediate voltage source to said node.

In some embodiments said step of connecting said intermediate voltage source to said node, is performed in response to said high voltage rail reaching a value that is between 80% and 120% of a voltage level of said intermediate voltage source.

In some embodiments there is provided circuitry comprising: a high voltage rail for providing a high voltage level corresponding to a first higher voltage domain; an intermediate voltage source; a low voltage rail; and a plurality of devices configured to operate in a second lower voltage domain; said circuitry being configured such that a first set of said plurality of devices are arranged in an upper voltage region where they are powered between said high voltage rail and an intermediate voltage rail powered by said intermediate voltage source and a second set of said plurality of devices are arranged in a lower voltage region where they are powered between said intermediate voltage rail and said low voltage rail, said circuitry being configured such that on power up said intermediate voltage source is powered before said high voltage rail, said circuitry further comprising: an isolating circuit arranged in said upper voltage region, said isolating circuit comprising at least one switching device for connecting said intermediate voltage source to at least one p-well of at least one NFET device in said first set of said plurality of devices in response to said high voltage rail being powered and for isolating said at least one p-well from said intermediate voltage source and for connecting said at least one node to said high voltage rail in response to said intermediate voltage source being powered and said high voltage rail not being powered in order to impede current flow from said intermediate voltage source to said high voltage rail via said p-well when said high voltage rail is not powered.

The above, and other objects, features and advantages of this invention will be apparent from the following detailed description of illustrative embodiments which is to be read in connection with the accompanying drawings.

DESCRIPTION OF NON-LIMITING AND EXAMPLE EMBODIMENTS

Figure 1:
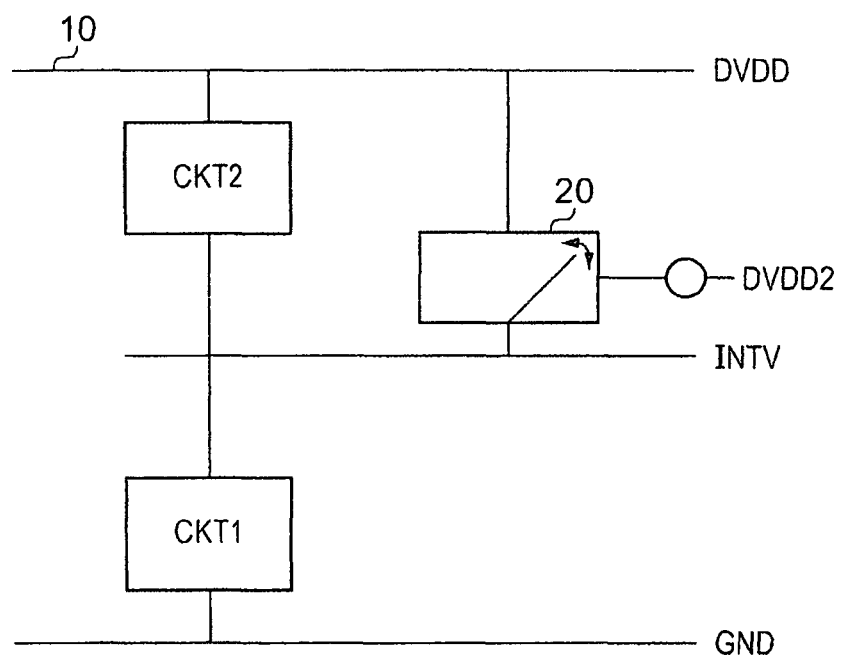
FIG. 1 shows circuitry operating in a higher power domain with an intermediate voltage rail and with isolating circuit according to an embodiment of the present invention.

FIG. 1 shows circuitry 10 according to an embodiment of the present invention. Circuitry 10 comprises a high voltage rail DVDD, an intermediate voltage rail INTV and a low voltage rail GND. The devices operating within this circuitry are devices that are designed to operate not at the voltage level of the high voltage domain DVDD but are more modern devices that are designed to operate at a lower voltage level of a lower voltage domain. This lower voltage domain has an upper voltage of DVDD2 and a voltage source for this domain is used to power an intermediate voltage rail and thereby provide an intermediate voltage level INTV. This intermediate voltage rail is used to protect the various devices in this circuitry 10, and these devices are arranged either between the higher voltage rail DVDD and the intermediate voltage rail INTV in the case of CKT2 or they are arranged between the intermediate voltage rail INTV and to ground as in CKT1.

Thus, in this circuit by providing an intermediate voltage rail between the higher voltage rail and ground the devices within each of the separate circuits CKT2 and CKT1 do not see the full voltage drop between DVDD and ground but merely see a portion of it, i.e. the portion between DVDD and the intermediate voltage and a portion between the intermediate voltage and ground.

In order to protect the devices in CKT2 from seeing the full voltage drop of DVDD on power up, circuitry 10 is designed so that power is supplied to the intermediate voltage source DVDD2 before it is supplied to the higher voltage source DVDD. This can, however, generate is own problems in that if the intermediate voltage rail is powered before the high voltage rail then the devices in CKT2 may become reverse biased and this can cause significant leakage currents. In order to avoid this happening isolating circuit 20 is provided.

Isolating circuit 20 is a switching circuit that is responsive to the voltage level of the high voltage level rail DVDD. When the high voltage rail is not powered the isolating circuit 20 connects it to the intermediate voltage rail. In response to detecting it transitioning from 0 to its high value, isolating circuit 20 switches so that the intermediate voltage source DVDD2 is connected to the intermediate voltage rail. Provided that the isolating circuit operates in response to the high voltage rail reaching an appropriate voltage level and it reacts quickly enough, then the problem with reverse biasing the devices within CKT2 can be avoided, while still providing protection to these devices. In effect isolating circuit 20 needs to switch as the voltage on the high power rail reaches the intermediate voltage level, so that the devices in CKT2 are not reverse baised and nor do they see a voltage drop that is significantly larger than VDDD2.

Figure 2:
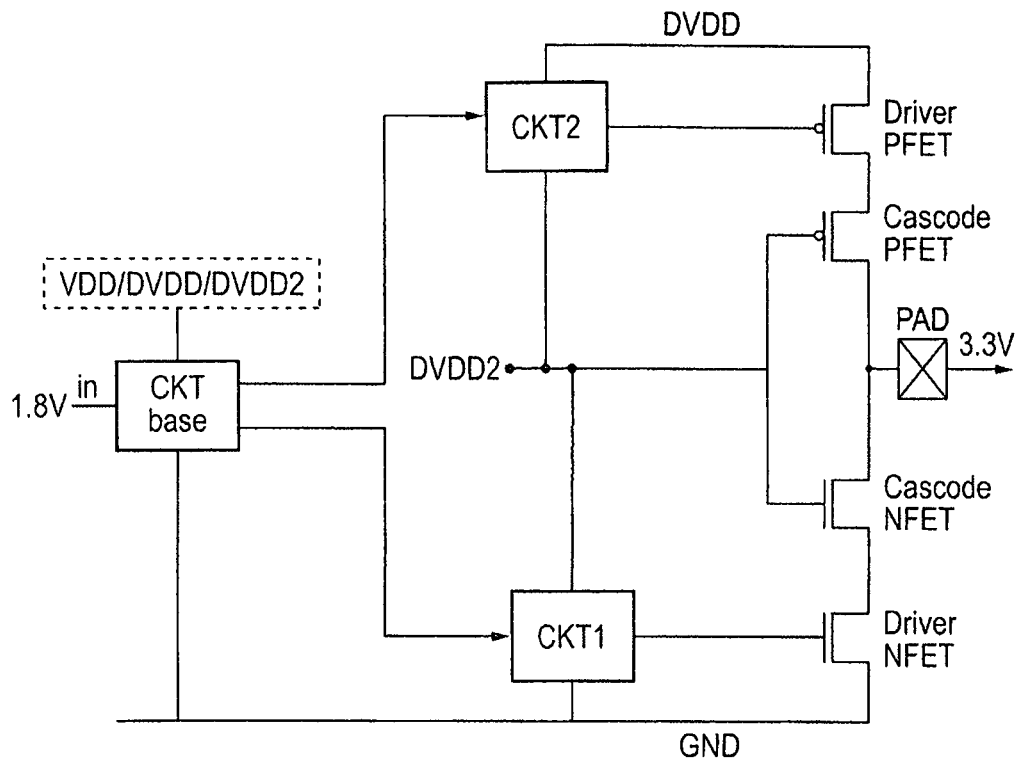
FIG. 2 shows a block diagram of a cascoded output device using 1.8 volt devices in a 3.3 volt output domain.

FIG. 2 shows a block diagram of a cascoded input-output cell using 1.8 volt devices and using a secondary supply of 1.8 volts as intermediate voltage DVDD2. Such an input-output cell is a typical sort of device where the problems of using devices designed for a lower voltage domain in a higher voltage domain may occur. This input-output cell is located on a core which operates at 1.8 volts and the signals it receives are from the core and are in the 1.8 volt power domain. However, it is supplying signals to devices that operate at 3.3 volts. These may be a hard disc driver or LEDs or some other device that operates at these voltage levels.

In order to address this it has a cascoded output driver which is arranged between DVDD and ground but has the intermediate voltage DVDD2 supplied as an intermediate voltage level such that there is an upper circuit CKT2 that operate in the upper voltage regions between DVDD and DVDD2 and a lower circuit CKT1 that operate in the lower voltage region between DVDD2 and ground. The output pad switches between 0 and DVDD and therefore outputs a signal of the required value for the equipment that it is signalling to.

In order to provide the correct signal levels for CKT1 and CKT2 CKTbase provides a signal level shifter to shift the input signals to a level between 1.8V and 3.3V for the signals sent to CKT2, while leaving them at their input value for CKT1.

As mentioned previously, in order to protect CKT2 from having the whole of DVDD falling across it, it is important that DVDD2 is switched on before DVDD. However, this can lead to problems with some devices arranged between DVDD and DVDD2 becoming reverse biased.

Figure 3:
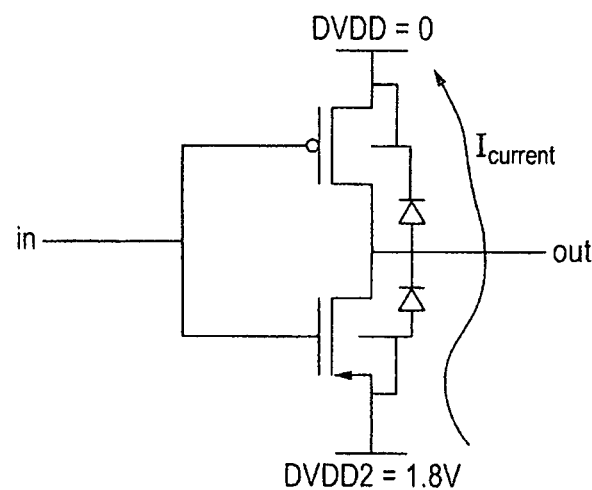
FIG. 3 shows leakage current arising in the CKT2 type of circuit of FIG. 2 during power sequencing.

FIG. 3 shows such leakage currents arising in an extremely simplified version of CKT2. In this example, CKT2 is a simple inverter with an NFET and PFET arranged in series between DVDD and DVDD2. When powering up DVDD2 goes high before DVDD and in this case there is 1.8 volts on the DVDD2 node and 0 volts on the DVDD.

An NFET transistor sits in a P-well and the P-well is generally tied to a low voltage while the N-well of the PFET transistor is tied to the high voltage. This means that when they are reversed biased in this way there is a significant leakage current running between them via parasitic diodes as can be seen in the Figure. However, the P-well of the NFET device cannot be tied to ground to avoid this happening as this would result in oxide stress on the NFET.

One way of addressing this problem would be to address it in a similar way to that shown in FIG. 1 where the whole of the 1.8 volt power supply is delayed from reaching the CKT2 circuit before DVDD is powered up. However, this would increase the impedance of the virtual ground of CKT2.

Figure 4:
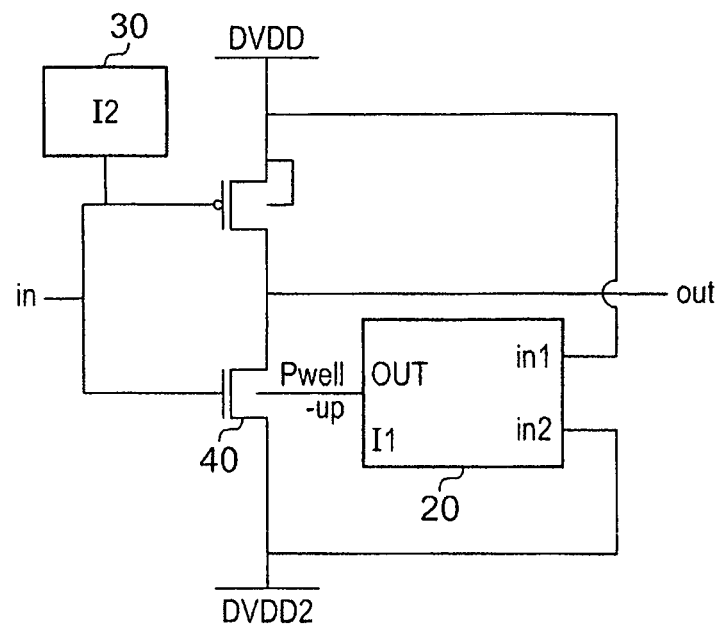
FIG. 4 shows in block form isolating circuits and control devices to address problems during power sequencing.

FIG. 4 shows how this problem is addressed in an embodiment of the present invention. In this embodiment isolating circuit 20 is placed so that it connects with the P-well of the NFET device and with both DVDD and DVDD2. This device delays the arrival of their well polarisation until DVDD powers up.

Isolating circuit 20 comprises switches which when both power supplies are powered up connect the P-well to DVDD2 but when DVDD2 is powered up and DVDD is not powered up connect the P-well to DVDD.

It is also important that these NFETS are switched off during this process as there will be significant current flowing from DVDD2 to DVDD through these devices when they are reverse biased if they are not switched off. Thus, to address this problem there is provided a control circuit 30.

Control circuit 30 must have the function that it is turned off when DVDD and DVDD2 power supplies are both powered up so that it has no effect on the circuit in normal operation. However, when DVDD2 power supply is powered up and DVDD power supply is powered down then it must set the gate of the NFET 40 to 0 to turn it off.

Although this has been shown for the p-well of the NFET, an alternative solution to the leakage current would be to control the voltage of the n-well of the PFET using similar switching circuitry. As the n-well should be held at a high voltage, switching circuitry is required such that when DVDD2 powers up and DVDD is low the p-well is held at DVDD2 rather than at 0. Then when DVDD rises above DVDD2 the switching circuit switches and the n-well is held at DVDD. In this embodiment a further control circuit 30 is required to turn the PFET off when it is reverse biased by providing a 0 at its input.

Figure 5A:
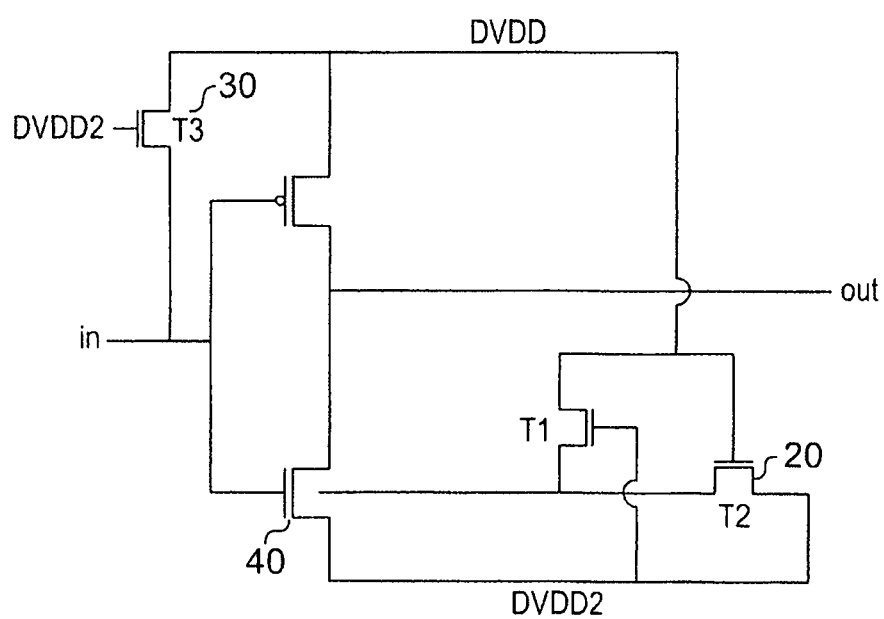
FIG. 5a shows a transistor level implementation of FIG. 4.

FIG. 5a shows a transistor level implementation of the device of FIG. 4. In this device isolating circuitry 20 is implemented as two transistors T1 and T2. It should be noted that this way of implementing isolating circuit 20 could also be used in the embodiment of FIG. 1. These two NFET transistors are arranged such that when DVDD and DVDD2 power supplies are both powered up T1 is off and T2 is on. In this case we then have the P-well of transistor 40 tied to DVDD2. When DVDD2 power supply is powered up and DVDD power supply is powered down then the NFET T1 is on and the NFET T2 is off. At this point we have the P-well tied to DVDD which is 0. In this way, the transistors are responsive to the changes in DVDD and switch at the appropriate moment to control the P-well bias voltage in a suitable manner.

Control device 30 comprises a NFET transistor T3 which turns NFET 40 off when DVDD is low and DVDD2 is high. This avoids leakage currents leaking through this transistor from DVDD2 to DVDD. Thus, in this case when DVDD is high and DVDD2 is high T3 is turned off and does not interfere with the circuit. However, when DVDD is low and DVDD2 is high T3 conducts the low value of DVDD to the gate of NFET transistor 40 thereby turning it off.

It should be noted that by arranging the transistors in this way so that they react to the DVDD signal as it ramps up means that they switch at the appropriate moment thereby preventing any stress caused by over voltage on the devices.

It is appropriate to use isolating circuit 20 to provide the correct bias voltage to the P-well of all NFETs in CKT2. It is also appropriate to apply the control device 30 to any one NFET that is on a current path from DVDD2 to DVDD. Thus, if there are two NFETs in series only one of them needs to be switched off by the T3 device 30, however if the NFET is in series with a PFET as in the example of FIG. 5a then the NFET does need to be switched off using the control device 40. Thus, for an OR gate for example both NFETs of the gate must be switched off while for a NAND gate only one of the NFETs needs to be switched off as they are in series.

Figure 5B:
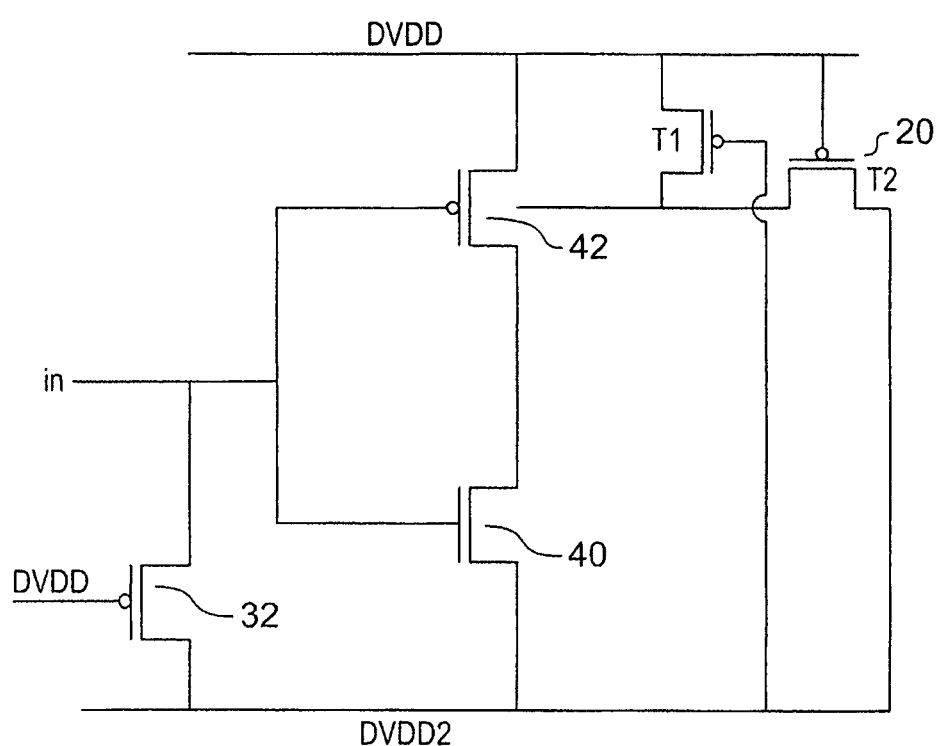
FIG. 5b shows a transistor level implementation of an alternative embodiment where the PFET rather than the NFET is controlled.

FIG. 5b shows the corresponding circuit for providing the leakage current protection by biasing the PFET 42 of FIG. 4. In this device isolating circuitry 20 is implemented as two PFET transistors T1 and T2. These two PFET transistors are arranged such that when DVDD and DVDD2 power supplies are both powered up T2 is off and T1 is on. In this case we then have the n-well of transistor 42 tied to DVDD. When DVDD2 power supply is powered up and DVDD power supply is powered down then T1 is off and the T2 is on. At this point we have the n-well tied to DVDD2. In this way, the transistors are responsive to the changes in DVDD and switch at the appropriate moment to control the n-well bias voltage in a suitable manner.

Control device 32 comprises a PFET transistor which turns PFET 42 off when DVDD is low and DVDD2 is high. This avoids leakage currents leaking through this transistor from DVDD2 to DVDD. Thus, in this case when DVDD is high and DVDD2 is high transistor 32 is turned off and does not interfere with the circuit. However, when DVDD is low and DVDD2 is high transistor 32 conducts the high value of DVDD2 to the gate of PFET transistor 42 thereby turning it off.

It should be noted that by arranging the transistors in this way so that they react to the DVDD signal as it ramps up means that they switch at the appropriate moment thereby preventing any stress caused by over voltage on the devices.

It is appropriate to use isolating circuit 20 to provide the correct bias voltage to the n-well of all PFETs in CKT2. It is also appropriate to apply the control device 32 to any one PFET that is on a current path from DVDD2 to DVDD. Thus, if there are two PFETs in series only one of them needs to be switched off by device 32. However if the PFET is in series with an NFET as in the example of FIG. 5b then the PFET does need to be switched off using the control device 32.

Figure 6:
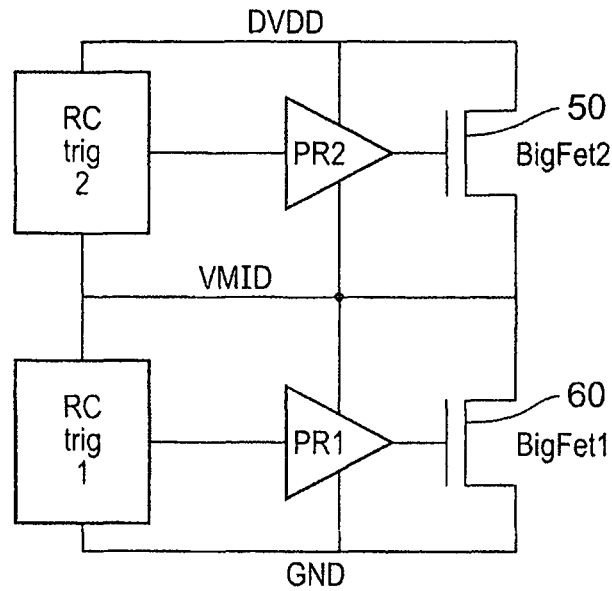
FIG. 6 shows an electrostatic discharge clamp.

FIG. 6 shows an electrostatic discharge ESD clamp for use in a circuit such as that disclosed in the previous embodiments that has a high voltage rail and an intermediate voltage rail.

ESD clamps are RC triggered devices that are used to react to and dissipate electrostatic events. Thus, in response to a sudden voltage spike the RC trigger turns a large transistor on and this large transistor can then dissipate the high voltage spike by conducting a large current and thereby protect the circuit. These devices are well known, however having a circuit that is configured with devices that are designed to operate in a voltage domain that is lower than the voltage domain that the devices are actually operating in presents problems for the ESD clamp.

In the embodiment of FIG. 6 there are two large transistors 50 and 60 that are arranged in series and are used to dissipate the energy. These two transistors are configured to operate in the lower voltage domain and thus, in this embodiment one transistor 50 is arranged between the high voltage rail DVDD and a VMID or intermediate voltage and the other transistor 60 is arranged between the intermediate voltage and ground.

In order to avoid overstressing the devices this intermediate voltage should not vary greatly. As these devices vary largely from wafer to wafer, you can't rely on the voltage drop across the two transistors 50 and 60 being approximately equal to protect them from substantially the whole DVDD falling across a single device. For this reason the voltage in between these two devices has to be set at an intermediate voltage in some way.

It is not desirable to use a resistive bridge to do this as this would lead to DC current dissipation. In summary in order to address the problems that arise we need to polarise the VMID node such that there is no DC dissipation, we also want to avoid uncontrolled capacitance being added to this node as this would impact the RC triggers and we want to have no uncontrolled leakage i.e. junctions that are polarising to direct mode during power sequencing, in other words we don't want leakage paths from DVDD2 to DVDD when DVDD is off and DVDD2 is on. Furthermore, the structure must not be sensitive to over-stress. This means that the middle node cannot be polarised only be the leakage of the devices as any mismatch between the leakage would lead to an uncontrolled value of middle voltage which could create reliability issues. For this reason the intermediate voltage level VMID is set using the intermediate voltage source, there are however drawbacks with this and these can be addressed using an isolating circuit 20 such as has been used in previous embodiments.

Figure 7:
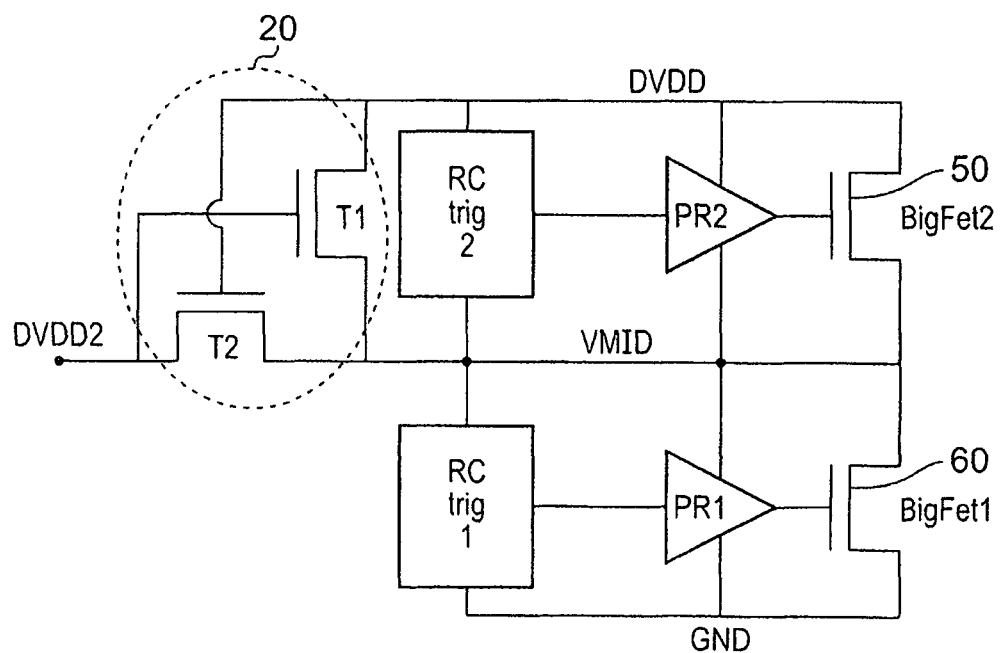
FIG. 7 shows an electrostatic discharge clamp with isolating circuitry according to an embodiment of the present invention.

FIG. 7 shows the device of FIG. 6 with the isolating circuit 20 in place to protect the circuitry and to avoid high leakage currents during power sequencing when DVDD is off and DVDD2 is on. As for the previous circuit this circuit is arranged such that DVDD never powers up before DVDD2. If it did then there would be the whole of DVDD across the big FET 50 which would stress this device and needs to be avoided. Thus, the intermediate VMID is provided to protect transistor 50 and powers up first. However, when DVDD2 is powered up and DVDD is off, there is a leakage current between DVDD2 and DVDD through transistor 50 which is on. As this is a large transistor this is a significant current.

In order to avoid this happening isolating circuit 20 which is formed of transistors T1 and T2 is arranged such that when DVDD and DVDD2 power supplies are both powered up transistor T1 is off and transistor T2 is on so that the intermediate voltage VMID is equal to DVDD2 and transistors 50 and 60 are both protected as the voltage that can fall across them is limited by this intermediate voltage. It should also be noted that by using the isolating circuit 20 which switches in response to DVDD ramping up any stress or over voltage on the devices as this power supply is ramping up is avoided.

However, when DVDD2 is powered up and DVDD power supply is still powered down then NFET T1 is on and NFET T2 is off. At this point we have VMID equal to the voltage on DVDD which is 0. This avoids any current flowing through either of the transistors 50 or 60.

Isolating circuit 20 also has another important advantage in that connecting the intermediate voltage source to VMID directly would connect an unknown capacitance to this node. This capacitance is related to the number of input-output cells that the source is driving and is therefore unknown. This capacitance affects the RC trigger circuit and as these are set to be triggered by events of particular frequencies this is undesirable. However, by connecting isolating circuit 20 between the VMID node and the intermediate voltage source to stop current leakage during power sequencing it has the additional effect that it provides isolation of the intermediate voltage source from the VMID node and this means that the trigger circuits remain substantially unaffected by the capacitance of this source. It should be noted that in order for appropriate isolation between the source and VMID to occur transistor T2 must be made to have a suitable resistance, but this is a straightforward design option.

Figure 8:
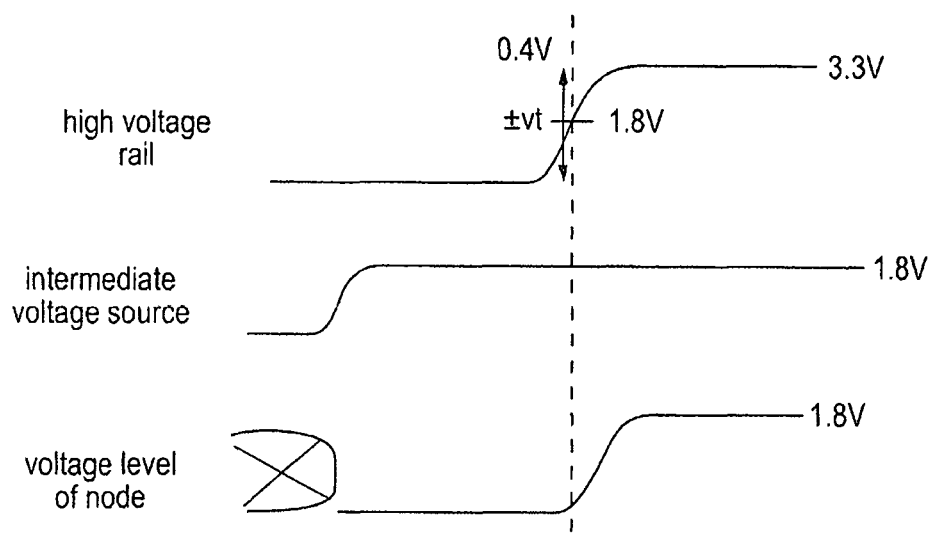
FIG. 8 shows a timing diagram illustrating how the signal level of the node changes in response to the powering up of the voltage sources.

FIG. 8 shows a timing diagram of how isolating circuit 20 formed from transistors T1 and T2 switches as the high power DVDD is turned on and ramps up. As can be seen, initially when both sources are off the voltage level of the isolated node, (in FIG. 7 VMID) is indeterminate and unimportant. When the intermediate voltage source is powered up, the voltage level of the node is zero, i.e. it is equal to the voltage level of the unpowered high voltage rail. When the high voltage rail starts to ramp up, the isolating device switches so that the node is connected to the intermediate voltage source and this happens when the high voltage rail reaches approximately 1.8V. This happens at this point is plus or minus the threshold voltages of the switching transistors T1 and T2, which are about 0.4V. Having a voltage of 1.8V+0.4 V across a device is not sufficient to overstress it and is acceptable and as such the isolating device provides in a simple and power efficient mariner acceptable protection for the devices.

Figure 9:
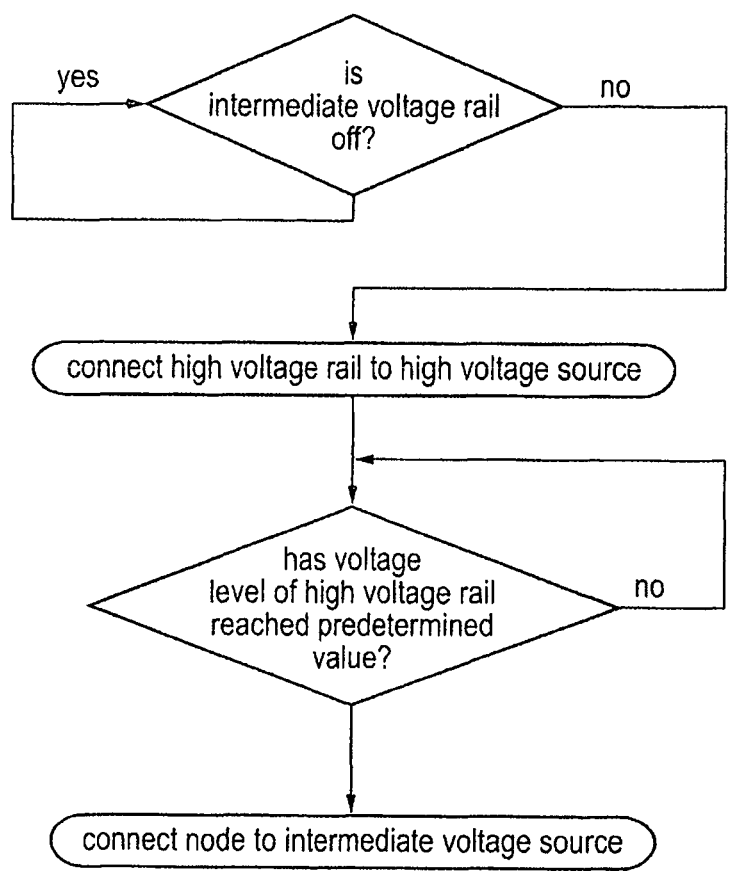
FIG. 9 shows a flow diagram illustrating a method according to an embodiment of the present invention.

FIG. 9 shows a flow diagram illustrating a method according to an embodiment of the present invention. Firstly it is determined if the intermediate voltage is off. If it is then the high voltage rail will also be off. When it is detected that he intermediate voltage has powered up, then the high voltage rail is connected to the high voltage source. At this point the isolating device becomes active and detects when the voltage level of the high voltage rail has reached a predetermined value, which is about the value of the intermediate voltage source. At this point the isolating device switches to connect the node to the intermediate voltage source. Previously the node was connected to the powered down high voltage rail.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. Circuitry comprising:
 a high voltage rail for providing a high voltage level corresponding to a first higher voltage domain;
 an intermediate voltage source;
 a low voltage rail; and a plurality of devices configured to operate in a second lower voltage domain;

said circuitry being configured such that a first set of said plurality of devices are arranged in an upper voltage region where they are powered between said high voltage rail and an intermediate voltage rail powered by said intermediate voltage source and a second set of said plurality of devices are arranged in a lower voltage region where they are powered between said intermediate voltage rail and said low voltage rail, said circuitry being configured such that on power up said intermediate voltage source is powered before said high voltage rail, said circuitry further comprising:

an isolating circuit arranged in said upper voltage region, said isolating circuit comprising at least one switching device for connecting said intermediate voltage source to at least one node in said circuitry in response to said high voltage rail being powered and for isolating said at least one node from said intermediate voltage source and for connecting said at least one node to said high voltage rail in response to said intermediate voltage source being powered and said high voltage rail not being powered in order to impede current flow from said intermediate voltage source to said high voltage rail via said node when said high voltage rail is not powered, wherein said at least one switching device of said isolating circuit is responsive to said high voltage rail reaching a predetermined value from a non-powered state and said intermediate voltage source being powered to switch and to connect said intermediate voltage rail and not said high voltage rail to said at least one node, said predetermined value being being within 20% of a voltage level of said intermediate voltage source.

2. Circuitry comprising:

a high voltage rail for providing a high voltage level corresponding to a first higher voltage domain;

an intermediate voltage source;

a low voltage rail; and a plurality of devices configured to operate in a second lower voltage domain;

said circuitry being configured such that a first set of said plurality of devices are arranged in an upper voltage region where they are powered between said high voltage rail and an intermediate voltage rail powered by said intermediate voltage source and a second set of said plurality of devices are arranged in a lower voltage region where they are powered between said intermediate voltage rail and said low voltage rail, said circuitry being configured such that on power up said intermediate voltage source is powered before said high voltage rail, said circuitry further comprising:

an isolating circuit arranged in said upper voltage region, said isolating circuit comprising at least one switching device for connecting said intermediate voltage source to at least one node in said circuitry in response to said high voltage rail being powered and for isolating said at least one node from said intermediate voltage source and for connecting said at least one node to said high voltage rail in response to said intermediate voltage source being powered and said high voltage rail not being powered in order to impede current flow from said: intermediate voltage source to said high voltage rail via said node when said high voltage rail is not powered, wherein said isolating circuit comprises:

a first switch arranged between said intermediate voltage source and said node, said first switch being responsive to a voltage level of said high voltage rail, such that in response to said high voltage rail being powered, said intermediate voltage source is connected to said node and in response to said high voltage rail not being powered said intermediate voltage source is isolated from said node; and a second switch arranged between said high voltage rail and said node, said second switch being responsive to said high voltage rail not being powered to connect said node to said high voltage rail and being responsive to said high voltage rail being powered to isolate said node from said high voltage rail; wherein said first and second switches consume current to switch and consume only leakage currents when switched.

3. Circuitry according to claim 2, wherein said first and second switches comprise first and second transistors.

4. Circuitry comprising:

high voltage rail for providing a high voltage level corresponding to a first higher voltage domain:, an intermediate voltage source;

a low voltage rail; and a plurality of devices configured to operate in a second lower voltage domain;

said circuitry being configured such that a first set of said plurality of devices are arranged in an upper voltage region where they are powered between said high voltage rail and an intermediate voltage rail powered by said intermediate voltage source and a second set of said plurality of devices are arranged in a lower voltage region where they are powered between said intermediate voltage rail and said low voltage rail, said circuitry being configured such that on power up said intermediate voltage source is powered before said high voltage rail, said circuitry further comprising:

an isolating circuit arranged in said upper voltage region, said isolating circuit comprising at least one switching device for connecting said intermediate voltage source to at least one node in said circuitry in response to said high voltage rail being powered and for isolating said at least one node from said intermediate voltage source and for connecting said at least one node to said high voltage rail in response to said intermediate voltage source being powered and said high voltage rail not being powered in order to impede current flow from said intermediate voltage source to said high voltage rail via said node when said high voltage rail is not powered, wherein said circuitry comprises an electrostatic discharge protection device comprising two discharge devices arranged in series between said high voltage rail and said low voltage rail, said two discharge devices being configured to operate in said second lower voltage domain, and said node being a node between said two devices.

5. Circuitry according to claim 4, wherein a first of said two discharge devices comprises:

a first transistor arranged between said high level voltage rail and said node, and a first resistive capacitive path arranged between said high voltage rail and said node, said gate of said first transistor being connected to said first resistive capacitive path;

a second of said two discharge devices comprises:

a second transistor arranged between said node and said low level voltage rail and a second resistive capacitive path arranged between said node and said low voltage rail, said gate of said second transistor being connected to said second resistive capacitive path;

such that a sudden change in voltage level causes a current to flow in said first and second resistive capacitive paths and turns said first and second transistors on, said node being connected to said intermediate voltage source via said isolating circuit when said high voltage rail and said intermediate voltage rail are powered.

6. Circuitry according to claim 4, wherein said at least one switching device of said isolating circuit for connecting said intermediate voltage source to said at least one node in said circuitry is configured to provide at least some isolation from a capacitance of said intermediate voltage source.

7. Circuitry according to claim 1, wherein said at least one node is connected to a p-well of at least one NFET device in said first set of devices.

8. Circuitry according to claim 7, wherein said first set of devices comprises a plurality of NFET devices, said circuitry comprising a plurality of nodes corresponding to said plurality of NFET devices, each of said plurality of nodes being connected to a p-well of said corresponding NFET device.

9. Circuitry according to claim 7, said circuitry comprising a control device responsive to said high voltage rail not being powered to switch said at least one NFET device off such that it does not conduct current between said intermediate voltage source and said high voltage rail.

10. Circuitry according to claim 9, wherein said control device comprises a transistor arranged to receive a signal from said intermediate voltage source at its gate and being arranged between said high voltage rail and an input of said at least one NFET device, such that when said high power rail is powered said control device is switched off and when said high power rail is not powered and said intermediate voltage rail is powered said control device transmits a control signal from said high power rail to switch said NFET device off.

11. Circuitry according to claim 9, wherein said control device is arranged to switch a plurality of said at least one NFET devices off, said plurality of NFET devices comprising at least one NFET device in every current path between said high voltage rail and said intermediate voltage rail.

12. Circuitry according to claim 1, wherein said at least one node is connected to an n-well of at least one PFET device in said first set of devices.

13. Circuitry according to claim 12, wherein said first set of devices comprises a plurality of PFET devices, said circuitry comprising a plurality of nodes corresponding to said plurality of PFET devices, each of said plurality of nodes being connected to a n-well of said corresponding PFET device.

14. Circuitry according to claim 12, said circuitry comprising a control device responsive to said high voltage rail not being powered to switch said at least one PFET device off such that it does not conduct current between said intermediate voltage source and said high voltage rail.

15. Circuitry according to claim 14, wherein said control device is arranged to switch a plurality of said at least one PFET devices off, said plurality of PFET devices comprising at least one PFET device in every current path between said high voltage rail and said intermediate voltage rail.

16. Circuitry according to claim 1, wherein said at least one node comprises said intermediate voltage rail, such that said isolating circuit is configured to connect said intermediate voltage rail to said intermediate voltage source in response to said high power rail being powered and to isolate said intermediate voltage source from said intermediate voltage rail in response to said intermediate voltage source being powered and said high power rail not being powered.

17. Circuitry according to claim 7, wherein said circuitry comprises an input-output cell for receiving a signal from said second lower voltage domain and for generating and outputting a signal to said first higher voltage domain.

18. Circuitry according to claim 17, said input-output cell comprising a cascoded output driver arranged between said high voltage rail and said low voltage rail, said intermediate voltage rail providing an intermediate voltage for said cascoded output driver.

* * * * *